US012800796B2

(12) United States Patent
Shin et al.

(10) Patent No.: US 12,800,796 B2
(45) Date of Patent: Nov. 17, 2026

(54) DISPLAY DEVICE COMPRISING ANTIREFLECTIVE LAYER

(71) Applicant: JUSUNG ENGINEERING CO., LTD., Gwangju-si (KR)

(72) Inventors: Yong Woo Shin, Gwangju-si (KR); Bong Sik Kim, Gwangju-si (KR); Won Tae Cho, Gwangju-si (KR); Chul Joo Hwang, Gwangju-si (KR)

(73) Assignee: JUSUNG ENGINEERING CO., LTD. (KR)

( * ) Notice: Subject to any disclaimer, the term of this patent is extended or adjusted under 35 U.S.C. 154(b) by 403 days.

(21) Appl. No.: 18/578,306

(22) PCT Filed: Jul. 15, 2022

(86) PCT No.: PCT/KR2022/010407

§ 371 (c)(1),
(2) Date: Jan. 10, 2024

(87) PCT Pub. No.: WO2023/003289

PCT Pub. Date: Jan. 26, 2023

(65) Prior Publication Data

US 2025/0012946 A1 Jan. 9, 2025

(30) Foreign Application Priority Data

Jul. 23, 2021 (KR) ........................ 10-2021-0097122

(51) Int. Cl.
*G02B 1/11* (2015.01)
*G02B 1/111* (2015.01)
(Continued)

(52) U.S. Cl.
CPC ........... *G02B 1/111* (2013.01); *H10H 20/855* (2025.01); *H10H 29/142* (2025.01); *H10K 59/12* (2023.02); *H10K 59/122* (2023.02); *H10W 90/00* (2026.01)

(58) Field of Classification Search
CPC .... G02B 1/111; H10H 20/855; H10H 29/142; H10W 90/00; H10K 59/8792; H10K 59/122; H10K 59/12; H10K 50/865; H10K 50/805; H10K 50/844; H10K 50/858; H10K 77/111; G09F 9/301
See application file for complete search history.

(56) References Cited

U.S. PATENT DOCUMENTS

2007/0024187 A1 2/2007 Shin et al.
2008/0129189 A1* 6/2008 Cok ........................ B82Y 20/00 313/506

(Continued)

FOREIGN PATENT DOCUMENTS

CN 112447931 A 3/2021
EP 3553637 A1 * 10/2019 ............. G06F 3/044

(Continued)

OTHER PUBLICATIONS

International Search Report for PCT/KR2022/010407 mailed Oct. 24, 2022.

*Primary Examiner* — Ida M Soward
(74) *Attorney, Agent, or Firm* — Renaissance IP Law Group LLP

(57) ABSTRACT

The present inventive concept provides a display device comprising: a first electrode provided on a substrate; a light-emitting layer provided on the first electrode; a second electrode provided on the light-emitting layer; and an antireflective layer, which is provided on the second electrode and comprises a light-absorbing material, wherein the light-absorbing material comprises at least (Continued)

one selected from the group consisting of amorphous carbon (a-C), a polymer, a monomer, metal and graphite.

15 Claims, 4 Drawing Sheets

(51) Int. Cl.

| | |
|---|---|
| ***H10H 20/855*** | (2025.01) |
| *H10H 29/14* | (2025.01) |
| *H10K 59/12* | (2023.01) |
| *H10K 59/122* | (2023.01) |
| *H10W 90/00* | (2026.01) |

(56) References Cited

U.S. PATENT DOCUMENTS

| | | | | |
|---|---|---|---|---|
| 2016/0079567 | A1 | 3/2016 | Cho et al. | |
| 2017/0278900 | A1 | 9/2017 | Yang et al. | |
| 2017/0317316 | A1* | 11/2017 | Yang | H10K 85/631 |
| 2018/0081085 | A1 | 3/2018 | Ge et al. | |
| 2018/0364521 | A1* | 12/2018 | Baek | H10K 50/86 |
| 2021/0143366 | A1 | 5/2021 | Park | |

FOREIGN PATENT DOCUMENTS

| | | | | | |
|---|---|---|---|---|---|
| JP | H08262203 | A | | 10/1996 | |
| JP | 2005019074 | A | * | 1/2005 | H10K 59/12 |
| JP | 2009238741 | A | | 10/2009 | |
| JP | 2014086314 | A | | 5/2014 | |
| JP | 2015144268 | A | | 8/2015 | |
| KR | 20050119894 | A | | 12/2005 | |
| KR | 20160002593 | A | | 1/2016 | |
| KR | 20160024061 | A | | 3/2016 | |
| KR | 20160137824 | A | | 12/2016 | |
| KR | 20170050229 | A | | 5/2017 | |
| KR | 20180075779 | A | | 7/2018 | |
| KR | 20190049966 | A | | 5/2019 | |
| KR | 20210004006 | A | * | 1/2021 | H10K 59/86 |
| TW | 200938651 | A | | 9/2009 | |
| TW | 202045962 | A | | 12/2020 | |
| WO | 2019124347 | A1 | | 6/2019 | |

* cited by examiner

DISPLAY DEVICE COMPRISING ANTIREFLECTIVE LAYER

TECHNICAL FIELD

The present inventive concept relates to a display device, and more particularly, to a display device including an anti-reflection layer.

BACKGROUND ART

In the related art, a polarization film is attached on a display surface of a display device so as to prevent the reflection of external light.

Because the polarization film includes a linear polarization film and a ¼% phase retardation film, a thickness of the polarization film is considerable.

Therefore, in a display device of the related art, there is a drawback where a thickness thereof is thick due to the polarization film, and due to the thick thickness, there is a limitation in implementing a rollable or foldable display device. Also, in a case where the polarization film is applied to the rollable or foldable display device, there is a problem where the polarization film having a thick thickness is stripped when an operation of rolling or bending the display device is repeated.

DISCLOSURE

Technical Problem

The present inventive concept is devised to solve the above-described problem and is for providing a display device in which an anti-reflection layer having a thin thickness is included therein, and thus, it is easy to implement a rollable or foldable display device and a problem where the anti-reflection layer is stripped may be prevented.

Technical Solution

To accomplish the above-described objects, the present inventive concept provides a display device including: a first electrode provided on a substrate; a light emitting layer provided on the first electrode; a second electrode provided on the light emitting layer; and an anti-reflection layer provided on the second electrode, the anti-reflection layer including a light-absorbing material, wherein the light-absorbing material includes at least one material selected from the group consisting of amorphous carbon (a-C), a polymer, a monomer, metal, metal oxide, and graphite.

The metal may include at least one material selected from the group consisting of tungsten and molybdenum.

The tungsten may include at least one material selected from the group consisting of [Bis(tert-butylimino)bis (dimethylamino)tungsten(VI)], [Pentacarbonyl(N,N-dimethylmethanamine)tungsten], and [pentacarbonyl(1-methylpyrrolidine)tungsten].

A first interface layer may be additionally provided on a top surface of the anti-reflection layer, and the first interface layer may have a refractive index between a refractive index of the anti-reflection layer and a refractive index of a layer, contacting the first interface layer, on the first interface layer.

The first interface layer may include at least one material selected from the group consisting of silicon nitride and silicon oxide.

A second interface layer may be additionally provided on a bottom surface of the anti-reflection layer, and the second interface layer may have a refractive index between a refractive index of the anti-reflection layer and a refractive index of a layer, contacting the second interface layer, under the second interface layer.

The second interface layer may include at least one material selected from the group consisting of silicone nitride and silicone oxide.

An encapsulation layer may be additionally provided on the second electrode, and the anti-reflection layer may be provided between the second electrode and the encapsulation layer.

An encapsulation layer including a first encapsulation layer and a second encapsulation layer may be additionally provided on the second electrode, and the anti-reflection layer may be provided between the first encapsulation layer and the second encapsulation layer.

An encapsulation layer and a hard coating layer may be additionally provided on the second electrode, and the anti-reflection layer may be provided between the encapsulation layer and the hard coating layer.

A hard coating layer may be additionally provided on the second electrode, and the anti-reflection layer may be provided on a top surface of the hard coating layer.

Moreover, the present inventive concept provides a display device including: a first electrode provided on a substrate; a light emitting layer provided on the first electrode; a second electrode provided on the light emitting layer; and an anti-reflection layer provided under the second electrode, the anti-reflection layer including a light-absorbing material, wherein the light-absorbing material includes at least one material selected from the group consisting of amorphous carbon (a-C), a polymer, a monomer, metal, and graphite.

The metal may include at least one material selected from the group consisting of tungsten and molybdenum.

The tungsten may include at least one material selected from the group consisting of [Bis(tert-butylimino)bis (dimethylamino)tungsten(VI)], [Pentacarbonyl(N,N-dimethylmethanamine)tungsten], and [pentacarbonyl(1-methylpyrrolidine)tungsten].

A first interface layer may be additionally provided on a bottom surface of the anti-reflection layer, and the first interface layer may have a refractive index between a refractive index of the anti-reflection layer and a refractive index of a layer, contacting the first interface layer, under the first interface layer.

The first interface layer may include at least one material selected from the group consisting of silicone nitride and silicone oxide.

A second interface layer may be additionally provided on a top surface of the anti-reflection layer, and the second interface layer may have a refractive index between a refractive index of the anti-reflection layer and a refractive index of a layer, contacting the second interface layer, on the second interface layer.

The second interface layer may include at least one material selected from the group consisting of silicone nitride and silicone oxide.

A circuit element layer may be additionally provided on the substrate, and the anti-reflection layer may be provided between the substrate and the circuit element layer.

The anti-reflection layer may be provided on a bottom surface of the substrate.

Advantageous Effect

According to an embodiment of the present inventive concept, because a light-absorbing material layer which is formed to have a thin thickness through a chemical vapor deposition process and includes at least one material selected from the group consisting of amorphous carbon (a-C), a polymer, a monomer, metal, metal oxide, and graphite is used as an anti-reflection layer, it is easy to implement a rollable or foldable display device as a thickness of the anti-reflection layer is thin, and moreover, a problem where the anti-reflection layer is stripped may be prevented even when the rollable or foldable display device is repeatedly rolled or bent.

Moreover, according to an embodiment of the present inventive concept, a light absorption rate of the anti-reflection layer may be adjusted by adjusting a thickness of the light-absorbing material layer, and thus, a reflectance of external light may be adjusted, thereby implementing a thin thickness and obtaining an effect which is similar to or better than that of an anti-reflection layer including a polarization film of the related art.

MODE FOR INVENTIVE CONCEPT

Figure 1:
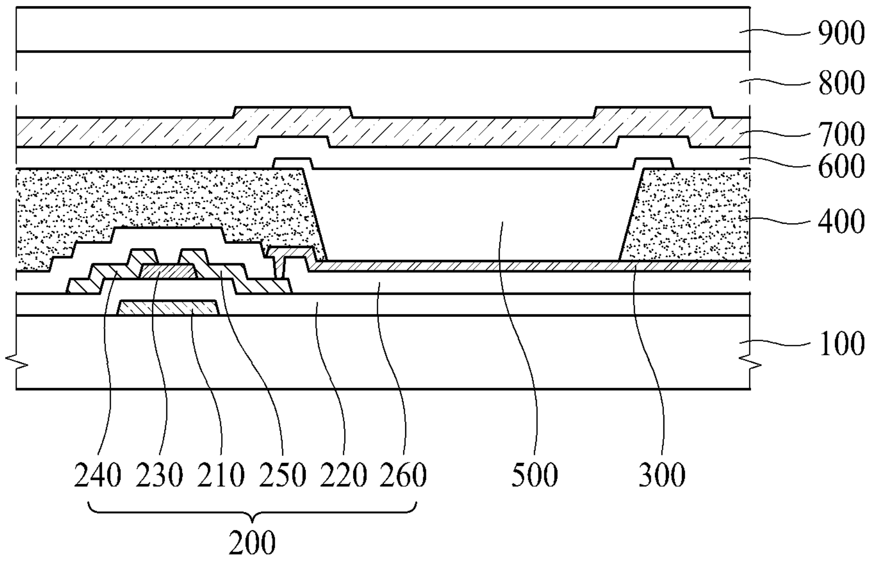
FIG. 1 is a schematic cross-sectional view of a display device including an anti-reflection layer according to an embodiment of the present inventive concept.

Advantages and features of the present inventive concept, and implementation methods thereof will be clarified through following embodiments described with reference to the accompanying drawings. The present inventive concept may, however, be embodied in different forms and should not be construed as limited to the embodiments set forth herein. Rather, these embodiments are provided so that this inventive concept will be thorough and complete, and will fully convey the scope of the present inventive concept to those skilled in the art. Furthermore, the present inventive concept is only defined by scopes of claims.

A shape, a size, a ratio, an angle, and a number disclosed in the drawings for describing embodiments of the present inventive concept are merely an example, and thus, the present inventive concept is not limited to the illustrated details. Like reference numerals refer to like elements throughout. In the following description, when the detailed description of the relevant known technology is determined to unnecessarily obscure the important point of the present inventive concept, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present inventive concept.

Features of various embodiments of the present inventive concept may be partially or overall coupled to or combined with each other, and may be variously inter-operated with each other and driven technically as those skilled in the art can sufficiently understand. The embodiments of the present inventive concept may be carried out independently from each other, or may be carried out together in co-dependent relationship.

Hereinafter, preferable embodiments of the present inventive concept will be described in detail with reference to the accompanying drawings.

FIG. 1 is a schematic cross-sectional view of a display device including an anti-reflection layer according to an embodiment of the present inventive concept.

As seen in FIG. 1, the display device including an anti-reflection layer according to an embodiment of the present inventive concept includes a substrate 100, a circuit element layer 200, a first electrode 300, a bank 400, a light emitting layer 500, a second electrode 600, an anti-reflection layer 700, an encapsulation layer 800, and a hard coating layer 900.

The display device according to an embodiment of the present inventive concept may be implemented as a top emission type where emitted light is upward discharged, and thus, the substrate 100 may include a transparent material such as glass as well as an opaque material such as plastic.

In a case where plastic is used as a material of the substrate 100, considering that a high temperature deposition process is performed on the substrate 100, polyimide which is capable of enduring a high temperature and is good in heat-resistant properties may be used as a material of the substrate 100, but the present embodiment is not limited thereto.

The circuit element layer 200 is formed on the substrate 100.

The circuit element layer 200 may include a gate electrode 210, a gate insulation layer 220, an active layer 230, a source electrode 240, a drain electrode 250, and a passivation layer 260. Although not shown, a buffer layer may be additionally formed between the substrate 100 and the gate electrode 210.

The gate electrode 210 is patterned on the substrate 100, and the gate insulation layer 220 is formed between the gate electrode 210 and the active layer 230 to insulate the gate electrode 210 from the active layer 230. The gate insulation layer 220 may include an inorganic insulating material such as silicone oxide or silicone nitride.

The active layer 230 is formed on the gate electrode 210 to overlap the gate electrode 210. The active layer 230 may include various semiconductor materials, such as a silicone-based semiconductor material or an oxide semiconductor material, known to those skilled in the art.

The source electrode 240 extends toward one side of the active layer 230 on the active layer 230, and the drain electrode 250 faces the source electrode 240 and extends toward the other side of the active layer 230 on the active layer 230.

A driving thin film transistor is configured by a combination of the gate electrode 210, the gate insulation layer 220, the active layer 230, the source electrode 240, and the drain electrode 250. The driving thin film transistor, as illustrated, may be formed in a bottom gate structure where the gate electrode 210 is provided under the active layer 230, but is not limited thereto and may also be formed in a top gate structure where the gate electrode 210 is provided on the active layer 230.

The passivation layer 260 is provided on the source electrode 240 and the drain electrode 250 to protect the driving thin film transistor. The passivation layer 260 may include an inorganic insulating material such as silicone oxide or silicone nitride. Although not shown, a planarization layer including an organic insulating material may be additionally formed between the passivation layer 260 and the first electrode 300.

The first electrode 300 is formed on the passivation layer 260. The first electrode 300 may be connected to the drain electrode 250 through a contact hole provided in the passivation layer 260. The first electrode 300 may function as an anode of the display device. The first electrode 300 may include a reflection layer so that light emitted from the light emitting layer 500 travels upward.

The bank 400 is formed on the passivation layer 260 to cover both ends of the first electrode 300. An exposure region of the first electrode 300, which is not covered and is exposed by the bank 400, may be an emission area. That is, the emission area may be defined by the bank 400. The bank 400 may be formed in a boundary region between a plurality of pixels, and thus, may be wholly formed in a matrix structure.

The light emitting layer 500 may be patterned on the first electrode 300. Particularly, the light emitting layer 500 may be formed in the emission area defined by the bank 400, and depending on the case, may extend up to a portion of a top surface of the bank 400. The light emitting layer 500 may include a red light emitting layer, a green light emitting layer, or a blue light emitting layer, which is patterned for each pixel.

The light emitting layer 500 may include a white light emitting layer, and in this case, the light emitting layer 500 may be formed in a stack structure where a red light emitting layer, a green light emitting layer, and a blue light emitting layer are stacked, or may be formed in a stack structure where a yellowish green light emitting layer and a blue light emitting layer are stacked. When the light emitting layer 500 includes the white light emitting layer, the light emitting layer 500 may be formed in a structure where the light emitting layer is not patterned for each of the plurality of pixels and is continued between the plurality of pixels.

The second electrode 600 is formed on the light emitting layer 500. The second electrode 600 may function as a common electrode in the plurality of pixels, and thus, may be continuously formed between the plurality of pixels without being disconnected. The second electrode 600 may function as a cathode of the display device. The display device according to an embodiment of the present inventive concept may be implemented as the top emission type, and thus, the second electrode 600 may include a transparent electrode or a semitransparent electrode.

The anti-reflection layer 700 is formed on the second electrode 600. In detail, the anti-reflection layer 700 is formed between the second electrode 600 and the encapsulation layer 800.

The anti-reflection layer 700 includes a material for absorbing light, and particularly, includes amorphous carbon (a-C). The amorphous carbon (a-C) may be deposited on the second electrode 600 through a chemical vapor deposition (CVD) process.

When the anti-reflection layer 700 includes the amorphous carbon (a-C), a film thickness of the amorphous carbon (a-C) may be adjusted, and thus, a light absorption rate of the anti-reflection layer 700 may be adjusted, thereby adjusting a reflectance of external light.

For example, in a case where the anti-reflection layer 700 is configured to absorb 50% light by adjusting the film thickness of the amorphous carbon (a-C), in a process where external light is incident on the inside of the display device, the anti-reflection layer 700 absorbs 50% light and only 50% light is transmitted to the inside of the display device, and when the transmitted light is reflected by an internal electrode or line of the display device, the anti-reflection layer 700 may again absorb 50% light, thereby allowing only 25% external light to be reflected finally.

Moreover, in displaying an image, only 50% of light emitted from the light emitting layer 500 may be absorbed by the anti-reflection layer 700, and an image may be displayed while discharging 50% light to the outside. As a result, 50% light may be discharged to the outside in displaying an image, but only 25% external light may be reflected in reflecting external light, thereby obtaining an effect which is similar to or better than that of an anti-reflection layer including a polarization film of the related art.

As described above, according to an embodiment of the present inventive concept, because the amorphous carbon (a-C) formed to have a thin thickness through a chemical vapor deposition process is used as the anti-reflection layer 700, it is easy to implement a rollable or foldable display device as a thickness of the anti-reflection layer 700 is thin, and moreover, a problem where the anti-reflection layer 700 is stripped may be prevented even when the rollable or foldable display device is repeatedly rolled or bent.

In addition to the amorphous carbon (a-C), a polymer, a monomer, metal, metal oxide, and graphite for absorbing light may be used as a material of the anti-reflection layer 700.

Accordingly, the anti-reflection layer 700 may include at least one material selected from the group consisting of amorphous carbon (a-C), a polymer, a monomer, metal, metal oxide, and graphite.

The polymer may be implemented at the low cost through a coating process of a printing process with atmospheric pressure.

The monomer has an advantage where it is possible to perform an evaporation process without vacuum break in a vacuum state.

The metal may include at least one material selected from the group consisting of tungsten and molybdenum. In this case, the tungsten may include at least one material selected from the group consisting of [Bis(tert-butylimino)bis (dimethylamino)tungsten(VI)], [Pentacarbonyl(N,N-dimethylmethanamine)tungsten], and [pentacarbonyl(1-methylpyrrolidine)tungsten].

The encapsulation layer 800 is formed on the anti-reflection layer 700. The encapsulation layer 800 may prevent external water from penetrating into the light emitting layer 500. The encapsulation layer 800 may include an inorganic insulating material, or may be formed in a structure where an inorganic insulating material and an organic insulating material are alternately stacked, but is not limited thereto.

The hard coating layer 900 is formed on the encapsulation layer 800. The hard coating layer 900 may be a layer which prevents a scratch of a surface of the display device and may perform a function of increasing the mechanical strength of the surface of the display device. The hard coating layer 900 may include various transparent materials known to those skilled in the art.

Figure 2:
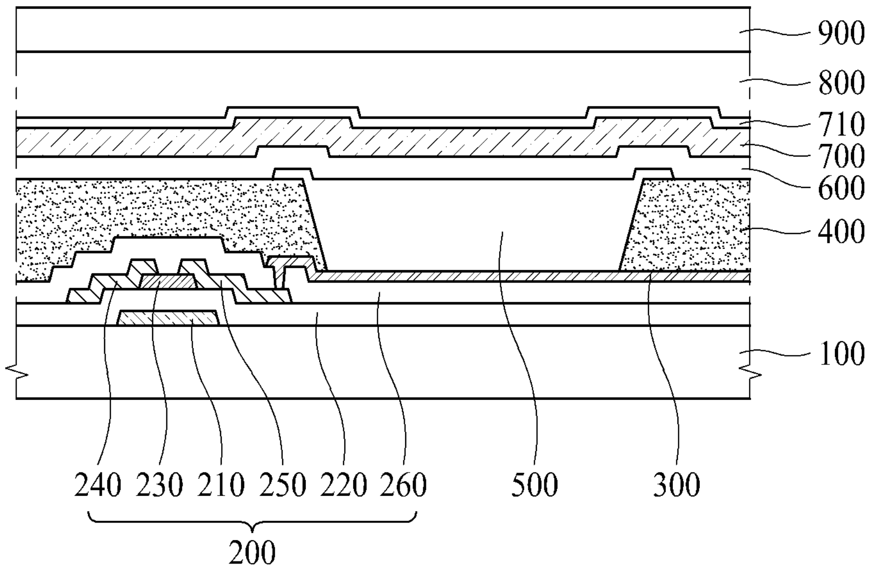
FIG. 2 is a schematic cross-sectional view of a display device including an anti-reflection layer according to another embodiment of the present inventive concept.

FIG. 2 is a schematic cross-sectional view of a display device including an anti-reflection layer according to another embodiment of the present inventive concept. Except for that a first interface layer 710 is additionally formed, the display device according to FIG. 2 is the same as the display device according to FIG. 1. Therefore, like reference numerals refer to like elements, and only a different element will be described below.

As seen in FIG. 2, according to another embodiment of the present inventive concept, a first interface layer 710 is additionally provided on a top surface of an anti-reflection layer 700. That is, the first interface layer 710 is formed on a top surface close to a display surface displaying an image in a surface of the anti-reflection layer 700, and in more detail, the first interface layer 710 is provided between the anti-reflection layer 700 and an encapsulation layer 800.

The first interface layer 710 allows external light passing through the encapsulation layer 800 to travel to an inner portion of the anti-reflection layer 700 without being totally reflected from the top surface of the anti-reflection layer 700. The first interface layer 710 is provided to have a refractive index within a range between a refractive index of the anti-reflection layer 700 and a refractive index of the encapsulation layer 800.

When a refractive index difference between a refractive index of the anti-reflection layer 700 and a refractive index of the encapsulation layer 800 is large, a problem occurs where external light incident through the encapsulation layer 800 does not travel to the inner portion of the anti-reflection layer 700 and is totally reflected from the top surface of the anti-reflection layer 700, and thus, in another embodiment of the present inventive concept, because the first interface layer 710 is additionally formed between the anti-reflection layer 700 and the encapsulation layer 800, the refractive index difference between a refractive index of the anti-reflection layer 700 and a refractive index of the encapsulation layer 800 is compensated for, thereby enabling external light to easily travel the inner portion of the anti-reflection layer 700.

The first interface layer 710 may include metal oxide such as silicone oxide, tungsten oxide, or titanium oxide, or may include silicone nitride.

Figure 3:
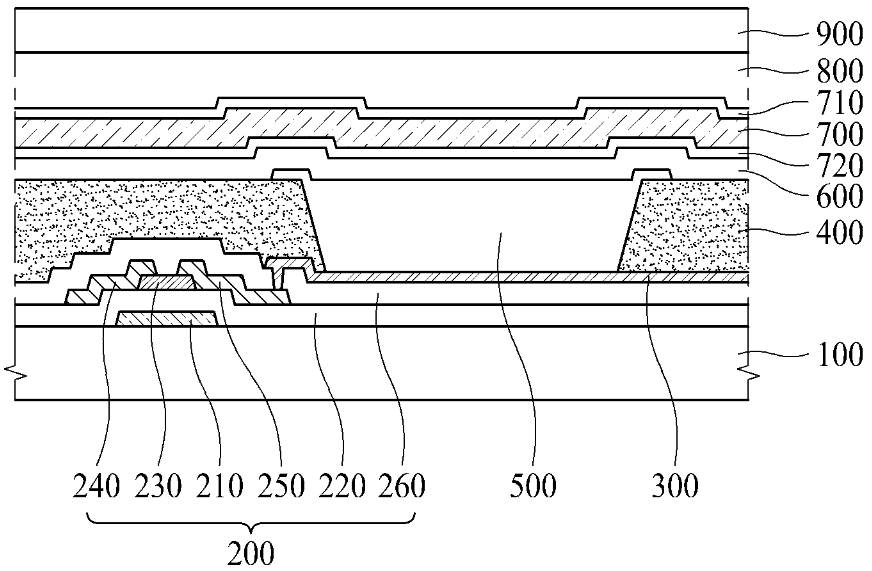
FIG. 3 is a schematic cross-sectional view of a display device including an anti-reflection layer according to another embodiment of the present inventive concept.

FIG. 3 is a schematic cross-sectional view of a display device including an anti-reflection layer according to another embodiment of the present inventive concept. Except for that a second interface layer 720 is additionally formed, the display device according to FIG. 3 is the same as the display device according to FIG. 2. Therefore, like reference numerals refer to like elements, and only a different element will be described below.

As seen in FIG. 3, according to another embodiment of the present inventive concept, a second interface layer 720 is additionally provided on a bottom surface of an anti-reflection layer 700. That is, the second interface layer 720 is formed on a bottom surface relatively far away from a display surface displaying an image in a surface of the anti-reflection layer 700, and in more detail, the second interface layer 720 is provided between the anti-reflection layer 700 and a second electrode 600.

The second interface layer 720 allows external light reflected from the inside of a display device to travel toward the anti-reflection layer 700 and travel to an inner portion of the anti-reflection layer 700 without staying in the display device. The second interface layer 720 is provided to have a refractive index within a range between a refractive index of the anti-reflection layer 700 and a refractive index of the second electrode 600.

When a refractive index difference between a refractive index of the anti-reflection layer 700 and a refractive index of the second electrode 600 is large, a problem occurs where external light passing through the second electrode 600 after being reflected from the inside of the display device does not travel to the inner portion of the anti-reflection layer 700 and is totally reflected from the bottom surface of the anti-reflection layer 700, and thus, in another embodiment of the present inventive concept, because the second interface layer 720 is additionally formed between the anti-reflection layer 700 and the second electrode 600, the refractive index difference between a refractive index of the anti-reflection layer 700 and a refractive index of the second electrode 600 is compensated for, thereby enabling external light to easily travel the inner portion of the anti-reflection layer 700.

The second interface layer 720 may include metal oxide such as silicone oxide, tungsten oxide, or titanium oxide, or may include silicone nitride.

Furthermore, although not shown, in a structure of FIG. 3, the first interface layer 710 may be omitted.

Figure 4:
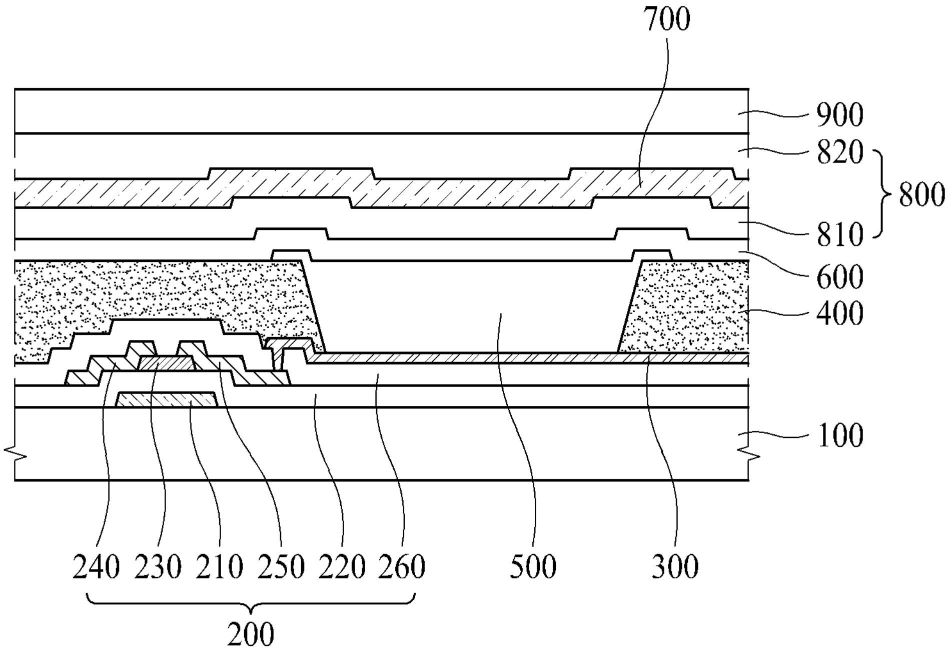
FIG. 4 is a schematic cross-sectional view of a display device including an anti-reflection layer according to another embodiment of the present inventive concept.

FIG. 4 is a schematic cross-sectional view of a display device including an anti-reflection layer according to another embodiment of the present inventive concept. A formed position of an anti-reflection layer 700 is changed, and thus, the display device according to FIG. 4 differs from the display device according to FIG. 1. Therefore, like reference numerals refer to like elements, and only a different element will be described below.

According to FIG. 1 described above, an anti-reflection layer 700 is provided between a second electrode 600 and an encapsulation layer 800.

On the other hand, according to FIG. 4, the anti-reflection layer 700 is provided in an encapsulation layer 800. That is, according to FIG. 4, a first encapsulation layer 810 is provided on the second electrode 600, the anti-reflection layer 700 is provided on the first encapsulation layer 810, and a second encapsulation layer 820 is provided on the anti-reflection layer 700.

The first encapsulation layer 810 and the second encapsulation layer 820 may include the same material, or may include different materials.

Furthermore, although not shown, a first interface layer 710 according to FIG. 2 described above may be additionally formed on a top surface of the anti-reflection layer 700, and in more detail, between the second encapsulation layer 820 and the anti-reflection layer 700, and moreover, a second interface layer 720 according to FIG. 3 described above may be additionally formed on a bottom surface of the anti-reflection layer 700, and in more detail, between the first encapsulation layer 810 and the anti-reflection layer 700.

In this case, the first interface layer 710 is provided to have a refractive index within a range between a refractive index of the anti-reflection layer 700 and a refractive index of the second encapsulation layer 820, and the second interface layer 720 is provided to have a refractive index within a range between a refractive index of the anti-reflection layer 700 and a refractive index of the first encapsulation layer 810.

Figure 5:
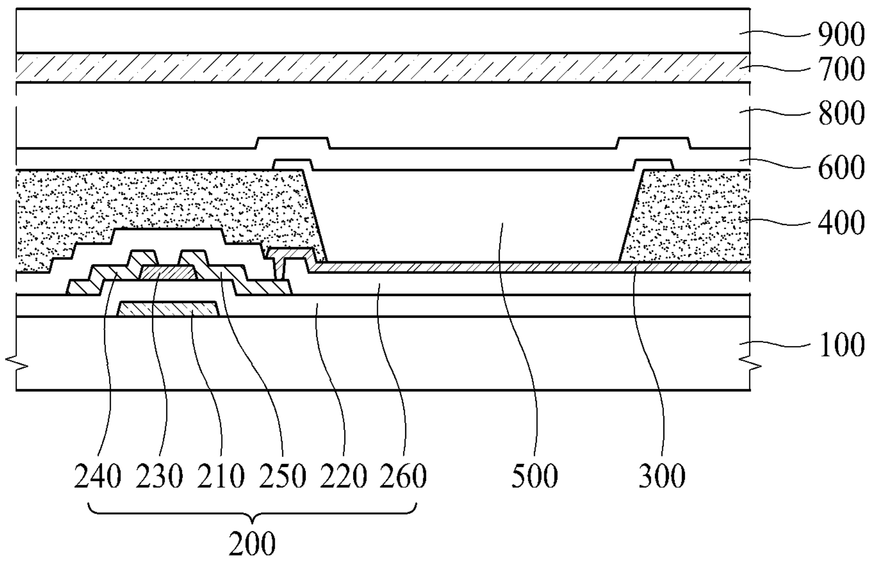
FIG. 5 is a schematic cross-sectional view of a display device including an anti-reflection layer according to another embodiment of the present inventive concept.

FIG. 5 is a schematic cross-sectional view of a display device including an anti-reflection layer according to another embodiment of the present inventive concept. A formed position of an anti-reflection layer 700 is changed, and thus, the display device according to FIG. 5 differs from the display device according to FIG. 1. Therefore, like reference numerals refer to like elements, and only a different element will be described below.

According to FIG. 5, an anti-reflection layer 700 is provided on a top surface of an encapsulation layer 800. That is, according to FIG. 5, the anti-reflection layer 700 is provided between the encapsulation layer 800 and a hard coating layer 900.

Furthermore, although not shown, a first interface layer 710 according to FIG. 2 described above may be additionally formed on a top surface of the anti-reflection layer 700, and in more detail, between the hard coating layer 900 and the anti-reflection layer 700, and moreover, a second interface layer 720 according to FIG. 3 described above may be additionally formed on a bottom surface of the anti-reflection layer 700, and in more detail, between the encapsulation layer 800 and the anti-reflection layer 700.

In this case, the first interface layer 710 is provided to have a refractive index within a range between a refractive index of the anti-reflection layer 700 and a refractive index of the hard coating layer 900, and the second interface layer 720 is provided to have a refractive index within a range between a refractive index of the anti-reflection layer 700 and a refractive index of the encapsulation layer 800.

Figure 6:
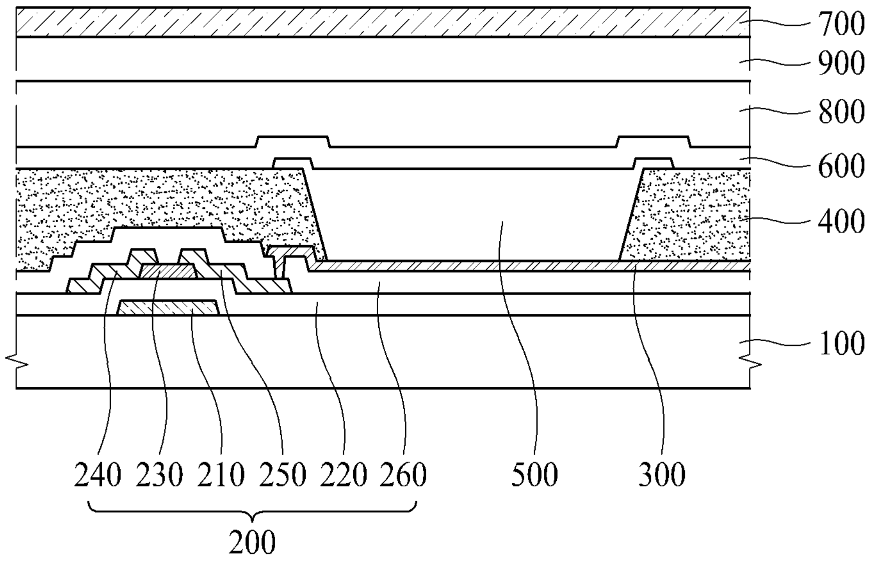
FIG. 6 is a schematic cross-sectional view of a display device including an anti-reflection layer according to another embodiment of the present inventive concept.

FIG. 6 is a schematic cross-sectional view of a display device including an anti-reflection layer according to another embodiment of the present inventive concept. A formed position of an anti-reflection layer 700 is changed, and thus, the display device according to FIG. 6 differs from the display device according to FIG. 1. Therefore, like reference numerals refer to like elements, and only a different element will be described below.

According to FIG. 6, an anti-reflection layer 700 is provided on a top surface of a hard coating layer 900. Furthermore, although not shown, a second interface layer 720 according to FIG. 3 described above may be additionally formed on a bottom surface of the anti-reflection layer 700, and in more detail, between the hard coating layer 900 and the anti-reflection layer 700.

In this case, the second interface layer 720 is provided to have a refractive index within a range between a refractive index of the anti-reflection layer 700 and a refractive index of the hard coating layer 900.

Figure 7:
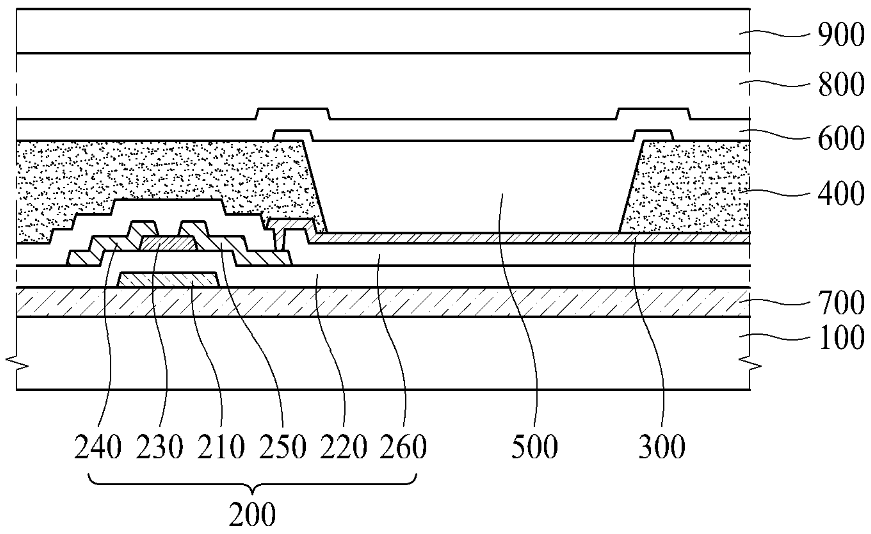
FIG. 7 is a schematic cross-sectional view of a display device including an anti-reflection layer according to another embodiment of the present inventive concept.
Figure 8:
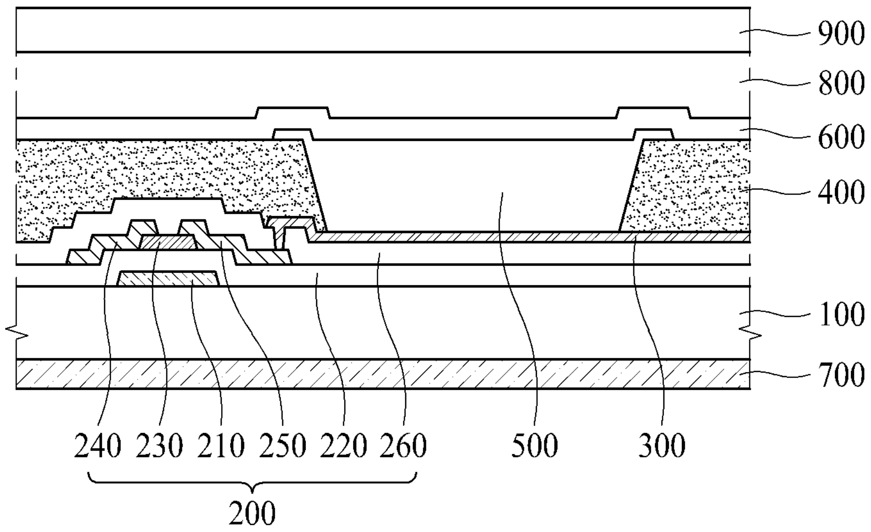
FIG. 8 is a schematic cross-sectional view of a display device including an anti-reflection layer according to another embodiment of the present inventive concept.

FIGS. 7 and 8 are schematic cross-sectional views of a display device including an anti-reflection layer according to another embodiment of the present inventive concept.

FIGS. 1 to 6 described above relate to a top emission type where emitted light is discharged upward, and thus, a first electrode 300 under a light emitting layer 500 includes a reflection layer, a second electrode 600 on the light emitting layer 500 includes a transparent or semitransparent electrode, and an anti-reflection layer 700 is provided on the light emitting layer 500.

On the other hand, FIGS. 7 and 8 relate to a bottom emission type where emitted light is discharged downward, and thus, a first electrode 300 under a light emitting layer 500 includes a transparent or semitransparent electrode, a second electrode 600 on the light emitting layer 500 includes a reflection electrode, and an anti-reflection layer 700 is provided under the light emitting layer 500.

Hereinafter, only elements which differ from FIGS. 1 to 6 described above will be described.

According to FIG. 7, the anti-reflection layer 700 is formed to contact a top surface of a substrate 100. In more detail, the anti-reflection layer 700 is provided between the substrate 100 and a circuit element layer 200.

Furthermore, although not shown, a first interface layer 710 according to FIG. 2 described above may be additionally formed on a bottom surface of the anti-reflection layer 700, and in more detail, between the substrate 100 and the anti-reflection layer 700, and moreover, a second interface layer 720 according to FIG. 3 described above may be additionally formed on a top surface of the anti-reflection layer 700, and in more detail, between the circuit element layer 200 and the anti-reflection layer 700.

In this case, the first interface layer 710 may be provided to have a refractive index within a range between a refractive index of the anti-reflection layer 700 and a refractive index of the substrate 100, and the second interface layer 720 may be provided to have a refractive index within a range between a refractive index of the anti-reflection layer 700 and a refractive index of the circuit element layer 200, particularly, a gate insulation layer 220.

According to FIG. 8, an anti-reflection layer 700 is formed to contact a bottom surface of the substrate 100. Furthermore, although not shown, a second interface layer 720 according to FIG. 3 described above may be additionally formed on a top surface of the anti-reflection layer 700, and in more detail, between the substrate 100 and the anti-reflection layer 700.

In this case, the second interface layer 720 may be provided to have a refractive index within a range between a refractive index of the anti-reflection layer 700 and a refractive index of the substrate 100.

Hereinabove, the embodiments of the present inventive concept have been described in more detail with reference to the accompanying drawings, but the present inventive concept is not limited to the embodiments and may be variously modified within a range which does not depart from the technical spirit of the present inventive concept. Therefore, it should be understood that the embodiments described above are exemplary from every aspect and are not restrictive. It should be construed that the scope of the present inventive concept is defined by the below-described claims instead of the detailed description, and the meanings and scope of the claims and all variations or modified forms inferred from their equivalent concepts are included in the scope of the present inventive concept.

The invention claimed is:

1. A display device comprising:

a first electrode provided on a substrate;

a light emitting layer provided on the first electrode;

a second electrode provided on the light emitting layer; and an anti-reflection layer provided on the second electrode, the anti-reflection layer including a light-absorbing material, wherein the light-absorbing material comprises at least one material selected from the group consisting of amorphous carbon (a-C), a polymer, a monomer, metal, and graphite, wherein an encapsulation layer including a first encapsulation layer and a second encapsulation layer is additionally provided on the second electrode, and the anti-reflection layer is provided between the first encapsulation layer and the second encapsulation layer.

2. The display device of claim 1, wherein a first interface layer is additionally provided on a top surface of the anti-reflection layer, and the first interface layer has a refractive index between a refractive index of the anti-reflection layer and a refractive index of a first additional layer, contacting the first interface layer, on the first interface layer.

3. The display device of claim 2, wherein the first interface layer comprises at least one material selected from the group consisting of silicone nitride and silicone oxide.

4. The display device of claim 1, wherein a second interface layer is additionally provided on a bottom surface of the anti-reflection layer, and the second interface layer has a refractive index between a refractive index of the anti-reflection layer and a refractive index of a second additional layer, contacting the second interface layer, under the second interface layer.

5. The display device of claim 4, wherein the second interface layer comprises at least one material selected from the group consisting of silicone nitride and silicone oxide.

6. The display device of claim 1, wherein an additional anti-reflection layer is provided between the second electrode and the encapsulation layer.

7. The display device of claim 1, wherein a hard coating layer is additionally provided on the second electrode, and an additional anti-reflection layer is provided between the encapsulation layer and the hard coating layer.

8. The display device of claim 1, wherein the metal comprises at least one material selected from the group consisting of tungsten and molybdenum.

9. The display device of claim 8, wherein the tungsten comprises at least one material selected from the group consisting of [Bis(tert-butylimino)bis (dimethylamino)tungsten(VI)], [Pentacarbonyl(N,N-dimethylmethanamine)tungsten], and [pentacarbonyl(1-methylpyrrolidine) tungsten].

10. A display device comprising:

a first electrode provided on a substrate;

a light emitting layer provided on the first electrode;

a second electrode provided on the light emitting layer; and an anti-reflection layer provided on the second electrode, the anti-reflection layer including a light-absorbing material, wherein the light-absorbing material comprises at least one material selected from the group consisting of amorphous carbon (a-C), a polymer, a monomer, metal, and graphite, wherein a hard coating layer is additionally provided on the second electrode, and the anti-reflection layer is provided on a top surface of the hard coating layer.

11. A display device comprising:

a first electrode provided on a substrate;

a light emitting layer provided on the first electrode;

a second electrode provided on the light emitting layer; and an anti-reflection layer provided under the second electrode, the anti-reflection layer including a light-absorbing material, wherein the light-absorbing material comprises at least one material selected from the group consisting of amorphous carbon (a-C), a polymer, a monomer, metal, and graphite.

12. The display device of claim 11, wherein a first interface layer is additionally provided on a bottom surface of the anti-reflection layer, and the first interface layer has a refractive index between a refractive index of the anti-reflection layer and a refractive index of a layer, contacting the first interface layer, under the first interface layer.

13. The display device of claim 11, wherein a second interface layer is additionally provided on a top surface of the anti-reflection layer, and the second interface layer has a refractive index between a refractive index of the anti-reflection layer and a refractive index of a layer, contacting the second interface layer, on the second interface layer.

14. The display device of claim 11, wherein a circuit element layer is additionally provided on the substrate, and the anti-reflection layer is provided between the substrate and the circuit element layer.

15. The display device of claim 11, wherein the anti-reflection layer is provided on a bottom surface of the substrate.

* * * * *